(12) United States Patent
Fujisato et al.

(10) Patent No.: US 8,592,712 B2
(45) Date of Patent: Nov. 26, 2013

(54) MOUNTING TABLE STRUCTURE AND PLASMA FILM FORMING APPARATUS

(75) Inventors: Toshiaki Fujisato, Nirasaki (JP); Ronald Nasman, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 732 days.

(21) Appl. No.: 12/725,902

(22) Filed: Mar. 17, 2010

(65) Prior Publication Data

US 2010/0244350 A1 Sep. 30, 2010

(30) Foreign Application Priority Data

Mar. 17, 2009 (JP) ................................. 2009-065236

(51) Int. Cl.
 *B23K 10/00* (2006.01)
 *H05H 1/16* (2006.01)

(52) U.S. Cl.
 USPC ............ 219/121.43; 219/121.58; 219/121.48; 118/723 R; 156/345.53; 315/111.21

(58) Field of Classification Search
 CPC ...................................................... H05H 1/16
 USPC ............. 219/121.43, 121.44, 121.52, 121.58; 315/111.21; 118/723 R, 723 I; 156/345.47, 345.53
 See application file for complete search history.

(56) References Cited

U.S. PATENT DOCUMENTS

| | | | |
|---|---|---|---|
| 2003/0066607 A1* | 4/2003 | White et al. ............. | 156/345.34 |
| 2006/0011611 A1 | 1/2006 | Goto et al. | |
| 2008/0200002 A1 | 8/2008 | Suzuki et al. | |
| 2009/0008035 A1* | 1/2009 | Iwai ......................... | 156/345.47 |
| 2010/0193491 A1 | 8/2010 | Cho et al. | |
| 2011/0048326 A1* | 3/2011 | Kato et al. ................ | 118/723 R |

FOREIGN PATENT DOCUMENTS

| | | |
|---|---|---|
| JP | 2002-514010 | 5/2002 |
| JP | 2003-249541 | 9/2003 |
| JP | 2003-282687 A | 10/2003 |
| KR | 10-2006-0048643 A | 5/2006 |
| KR | 10-2007-0051944 A | 5/2007 |
| KR | 10-2009-0024866 A | 3/2009 |
| WO | WO 2008/048518 A1 | 4/2008 |

OTHER PUBLICATIONS

Office Action issued Apr. 4, 2012, in Korean Patent Application No. 10-2010-0023486 with English translation.
Office Action issued Dec. 25, 2012 in Japanese Patent Application No. 2009-065236.

* cited by examiner

*Primary Examiner* — Mark Paschall
(74) *Attorney, Agent, or Firm* — Oblon, Spivak, McClelland, Maier & Neustadt, L.L.P.

(57) ABSTRACT

A mounting table structure for mounting thereon an object to be processed to form a metal-containing thin film on the object includes a ceramic mounting table in which a chuck electrode and a heater are embedded, and a metal flange connected to a bottom surface of a peripheral portion of the mounting table. The mounting table structure further includes a metal base which is joined to the flange by screws and has a coolant path for flowing a coolant therein, and a metal seal member interposed between the flange and the base.

12 Claims, 9 Drawing Sheets

<THIRD EMBODIMENT>

*FIG. 4*
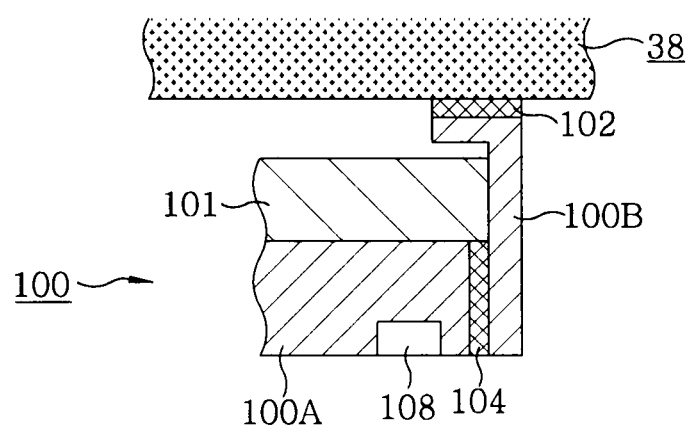
*FIG. 5A*  *FIG. 5B*
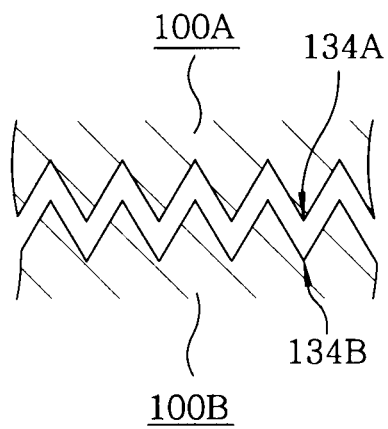 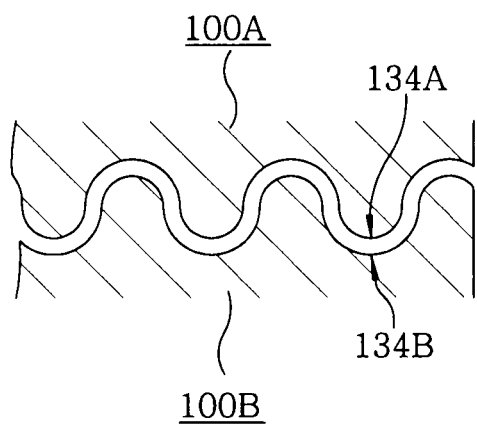

MOUNTING TABLE STRUCTURE AND PLASMA FILM FORMING APPARATUS

CROSS-REFERENCE TO RELATED APPLICATIONS

This application claims priority to Japanese Patent Application No. 2009-065236 filed on Mar. 17, 2009, the entire contents of which are incorporated herein by reference.

FIELD OF THE INVENTION

The present invention relates to a plasma film forming apparatus for forming a metal-containing thin film on an object to be processed, e.g., a semiconductor wafer, by using a plasma and a mounting table structure used therein.

BACKGROUND OF THE INVENTION

In general, various processes, e.g., a film forming process or a pattern etching process are repeatedly performed on a semiconductor wafer to manufacture semiconductor devices. With increased requirements for high-integration and high-miniaturization of semiconductor devices, a line width or hole diameter of the device is getting smaller. Further, conventionally, an aluminum alloy is widely used as a wiring material or a burying material. However, recently, there is a tendency to use tungsten (W), copper (Cu) or the like for meeting the requirements of a fine line width, a fine hole diameter and a high operating speed.

Further, when a metal material such as Al, W and Cu is used as a wiring material or a burying material for a contact hole, silicon may be diffused between an insulating material of, e.g., a silicon oxide ($SiO_2$) film and the metal materials. In order to prevent the diffusion of silicon or improve adhesivity of the film, a barrier layer is provided at a boundary between an insulating layer and a conductive layer formed thereunder. A Ta film, a TaN film, a Ti film, a TiN film or the like were widely known as the barrier layer. Further, a thin film containing metal such as Cu, Ti, Ta or the like is generally formed by using a plasma sputtering method and a plasma film forming apparatus (see, e.g., Japanese Patent Application Publication No. 2001-250816 or 2007-214387).

In the plasma film forming apparatus, for instance, a mounting table having a chuck electrode and a heater is placed in a vacuum evacuable processing chamber and a semiconductor wafer is mounted on the mounting table. The semiconductor wafer is attracted and held on the mounting table by an electrostatic force generated by a high voltage applied to the chuck electrode. In this state, metal ions generated from a metal target by a plasma are attracted to the mounting table by a high frequency bias power to form, e.g., a metal thin film on the semiconductor wafer. Further, the mounting table is provided with a cooling jacket in addition to the heater. The heater and the cooling jacket are controlled according to the amount of heat supplied to the semiconductor wafer from the plasma side such that the semiconductor wafer is maintained at a temperature suitable for film formation.

A conventional mounting table structure is illustrated in FIG. 10. A mounting table 2 includes a metal base 6 having a cooling jacket 4 and a thin ceramic heater 8 installed on the base 6. A chuck electrode 10 and a heater 12 are embedded in the ceramic heater 8. A semiconductor wafer W is mounted on the ceramic heater 8 to be attracted and held thereon by an electrostatic force. Further, the ceramic heater 8 is strongly attached to a top surface of the base 6 by an adhesive 14.

In the above-mentioned apparatus, any particular problem does not occur in a conventional case in which the design criterion is not very strict. However, when the design criterion becomes strict due to high integration and miniaturization of the semiconductor devices, it is required that the quality and characteristics of a metal film are improved. Accordingly, for example, in order to prevent contamination of the metal film due to foreign matter, it is required to discharge impurities attached to the surface of the processing chamber or an inner structure by outgassing by evacuating the processing chamber to a high vacuum level prior to the film formation. However, the adhesive 14 continuously emits an impurity gas of silicon compounds such as siloxane. Accordingly, it is difficult that the processing chamber is maintained at a high vacuum level and in a clean state.

Further, in order to improve the quality and characteristics of a thin film, it is required to perform a film forming process at a high process temperature of, e.g., about 400° C. However, the heat resistant temperature of the adhesive is very low, e.g., about 80° C. Thus, the adhesive cannot be used.

Further, there is a mounting table structure wherein a chuck electrode or a heater is buried in a mounting table by thermal spraying. However, also in this case, a thermally sprayed portion has a heat resistant temperature of at most about 80° C. and, thus, cannot endure the high temperature.

SUMMARY OF THE INVENTION

In view of the above, the present invention provides a mounting table structure capable of enduring a high temperature and a plasma film forming apparatus in which a processing chamber can be maintained at a high vacuum level by sufficiently performing a degassing treatment.

In accordance with a first embodiment of the present invention, there is provided a mounting table structure for mounting thereon an object to be processed to form a metal-containing thin film on the object, including: a ceramic mounting table in which a chuck electrode and a heater are embedded; a metal flange connected to a bottom surface of a peripheral portion of the mounting table; a metal base which is joined to the flange by screws and has a coolant path for flowing a coolant therein; and a metal seal member interposed between the flange and the base.

In accordance with a second embodiment of the present invention, there is provided a plasma film forming apparatus for forming a thin film containing metal on an object to be processed, including: a vacuum evacuable processing chamber; the mounting table structure for mounting thereon the object; a gas introduction unit for introducing a predetermined gas into the processing chamber; a plasma generating source for generating a plasma in the processing chamber; a metal target containing the metal; a target power supply for supplying a voltage to the metal target to attract ions of the gas; a bias power supply for supplying a bias power to the chuck electrode of the mounting table structure; and a chuck power supply for supplying a chuck voltage to the chuck electrode of the mounting table structure.

BRIEF DESCRIPTION OF THE DRAWINGS

The objects and features of the present invention will become apparent from the following description of embodiments, given in conjunction with the accompanying drawings, in which:

FIG. 4 is a partial cross sectional view showing a portion A of FIG. 3;

FIGS. 5A and 5B illustrate modification examples of the cross sectional shape of irregularities of the mounting table;

DETAILED DESCRIPTION OF THE EMBODIMENTS

Hereinafter, a mounting table structure and a plasma film forming apparatus in accordance with a first embodiment of the present invention will be described in detail with reference to the accompanying drawings which form a part hereof.

Figure 1:
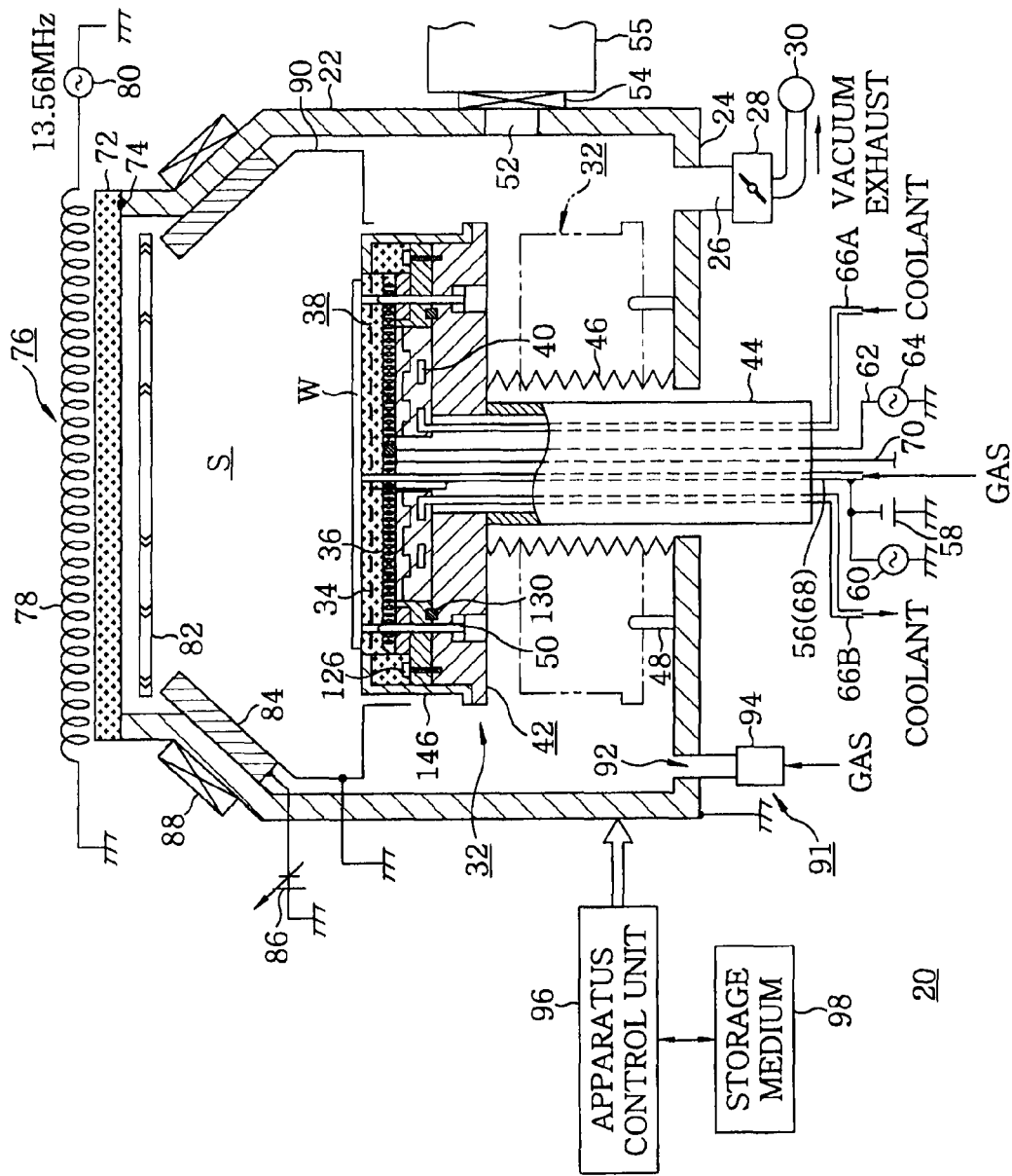
FIG. 1 is a cross sectional view showing a plasma film forming apparatus having a mounting table structure in accordance with a first embodiment of the present invention.
Figure 2:
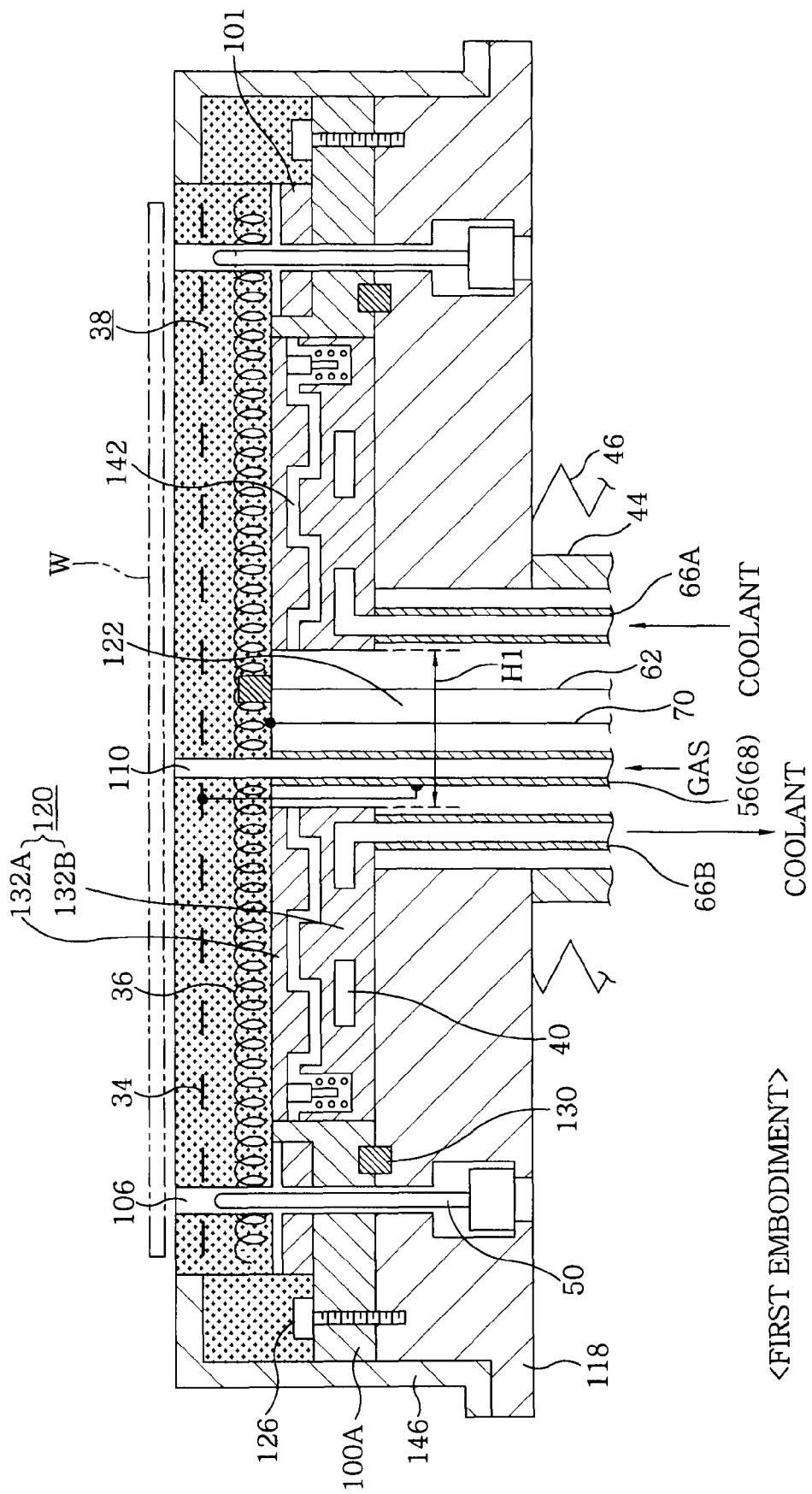
FIG. 2 is an enlarged cross sectional view showing essential parts of the mounting table structure of the first embodiment.
Figure 3:
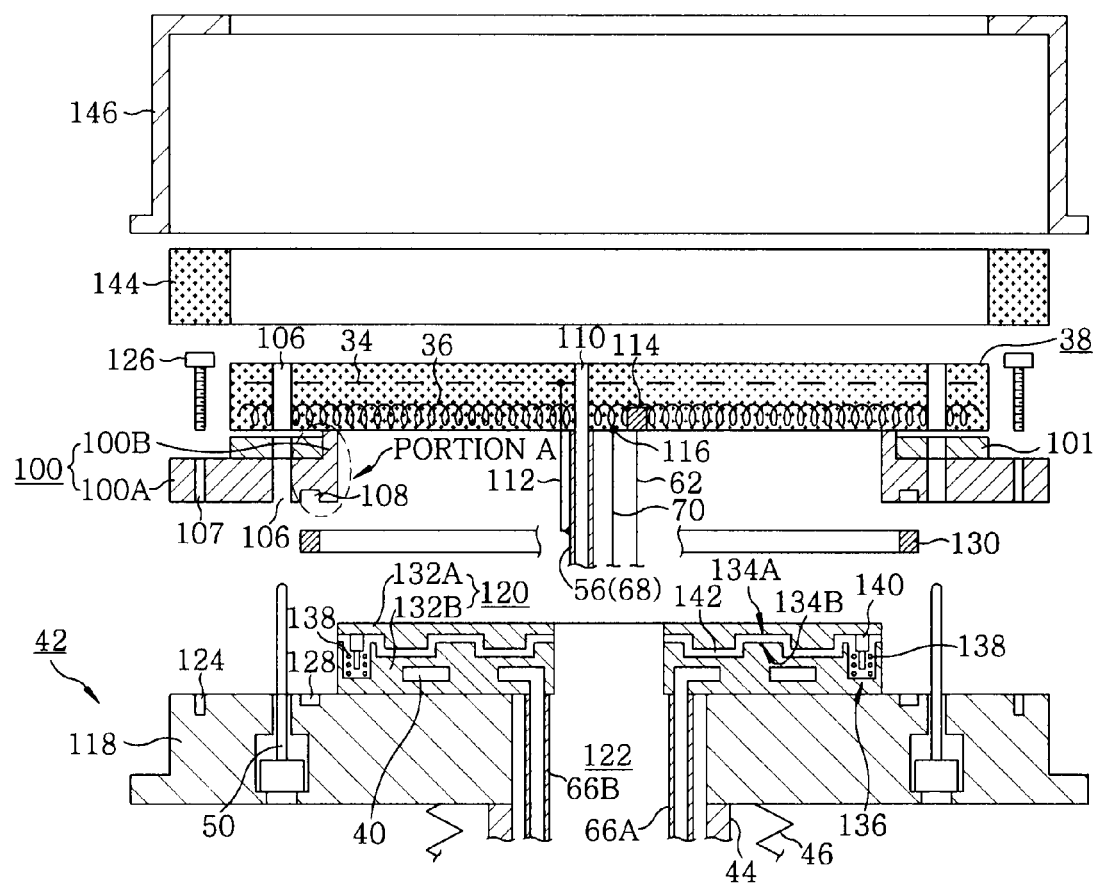
FIG. 3 is an exploded view showing essential parts of the mounting table structure of the first embodiment.

FIG. 1 is a cross sectional view showing a plasma film forming apparatus having a mounting table structure in accordance with a first embodiment of the present invention. FIG. 2 is an enlarged cross sectional view showing essential parts of the mounting table structure of the first embodiment. FIG. 3 is an exploded view showing essential parts of the mounting table structure of the first embodiment. FIG. 4 is a partial cross sectional view showing a portion A of FIG. 3. Herein, an inductively coupled plasma (ICP) sputtering apparatus is described as an example of the plasma film forming apparatus.

First, as shown in FIG. 1, a plasma film forming apparatus 20 includes a cylindrical processing chamber 22 made of, e.g., aluminum. The processing chamber 22 is grounded. A gas exhaust port 26 is provided at a bottom portion 24 of the processing chamber 22. The processing chamber 22 can be vacuum evacuated by a vacuum pump 30 via a throttle valve 28 for pressure control.

In the processing chamber 22, there is provided a mounting table structure 32 on which a semiconductor wafer W that is an object to be processed is mounted. The mounting table structure 32 mainly includes a ceramic mounting table 38 in which a chuck electrode 34 and a heater 36 are embedded and a metal base 42 which supports the mounting table 38 and has a coolant path 40 for flowing a coolant therein. The mounting table structure 32 will be described in detail later.

The base 42 is supported by a hollow support column 44 downwardly extending from a central bottom surface of the base 42. A lower portion of the support column 44 passes through the bottom portion 24 of the chamber. The support column 44 is formed of metal, e.g., stainless steel, aluminum or an aluminum alloy. Further, the support column 44 can be moved vertically by an elevating mechanism (not shown) to elevate the mounting table structure 32 itself. A metal bellows 46 that is extensible and contractible is provided to surround the support column 44. An upper end of the metal bellows 46 is airtightly joined to the bottom surface of the base 42, and a lower end of the metal bellows 46 is airtightly joined to a top surface of the bottom portion 24 of the chamber. Accordingly, the mounting table structure 32 can be moved vertically while maintaining airtightness of the processing chamber 22.

Further, three support pins (only two are shown in the drawing) 48 are uprightly provided at the bottom portion 24 of the chamber. The mounting table structure 32 is provided with vertically movable lifter pins 50 corresponding to the support pins 48. Accordingly, when the mounting table structure 32 is moved down, the lifter pins 50 are pushed up by the support pins 48 such that upper ends of the lifter pins 50 are protruded from the top surface of the mounting table 38 to lift up the semiconductor wafer W. In this state, the semiconductor wafer W can be transferred by a transfer arm (not shown) loaded from the outside. Accordingly, a gate 52 is provided at a lower sidewall of the processing chamber 22 and a gate valve 54 is provided at the gate 52 to allow loading of the transfer arm. Further, the gate valve 54 is connected to, e.g., a vacuum transfer chamber 55.

Further, the chuck electrode 34 provided in the mounting table 38 is connected to a chuck power supply 58 having a high voltage direct current and a bias power supply 60 which is a high frequency power supply for generating a high frequency power of, e.g., 13.56 MHz via an electrode line 56 inserted in the support column 44 to pass therethrough. Accordingly, the semiconductor wafer W can be attracted and held by an electrostatic force and a specific bias power for ion attraction can be applied to the mounting table 38. The electrode line 56 is formed of an electrically conductive metal pipe, e.g., a stainless steel pipe.

Further, the heater 36 provided in the mounting table 38 is connected to one end of a power supply line 62 inserted in the support column 44 to pass therethrough. The other end of the power supply line 62 is connected to a heater power supply 64 capable of controlling a power supply. Further, an inlet side and an outlet side of the coolant path 40 of the base 42 are respectively connected to two coolant tubes 66A and 66B inserted in the support column 44 to pass therethrough. The coolant path 40 allows a coolant, e.g., Galden (registered trademark) to flow therein under control.

Further, the electrode line 56 formed of a metal pipe also serves as a backside gas line 68 for supplying a heat transfer gas between the top surface of the mounting table 38 and the bottom surface of the semiconductor wafer W. The electrode line 56 allows a flow rate-controlled gas, i.e., a backside gas, to flow therethrough. A rare gas such as Ar can be used as the backside gas. Further, the backside gas line 68 may be provided separately from the electrode line 56. Further, a thermocouple line 70 for measuring the temperature of the mounting table 38 is inserted in the support column 44 to pass therethrough.

Meanwhile, a transmitting plate 72, which is transmissive to a high frequency wave and made of a dielectric material such as aluminum oxide, is airtightly provided at a ceiling portion of the processing chamber 22 via a seal member 74 such as an O ring. Further, a plasma generating source 76 is provided on the transmitting plate 72 to generate a plasma in a processing space S in the processing chamber 22 by converting an Ar gas serving as a plasma excitation gas into a plasma.

Further, another inert gas such as He gas and Ne gas may be used as a plasma excitation gas instead of Ar gas. Specifically, the plasma generating source 76 has an induction coil 78 provided corresponding to the transmitting plate 72. The induction coil 78 is connected to a high frequency power supply 80 for supplying a high frequency power of, e.g., 13.56

MHz for plasma generation. Accordingly, a high frequency wave can be introduced into the processing space S through the transmitting plate 72.

Further, a baffle plate 82 made of, e.g., aluminum is provided right under the transmitting plate 72 to diffuse the high frequency wave. Further, a metal target 84 is provided below the baffle plate 82 and is formed in a ring shape (truncated cone shape) having a cross section slanted inwardly to surround an upper side portion of the processing space S. The metal target 84 is connected to a target power supply 86 that is a variable DC power supply for supplying a voltage for Ar ion attraction. Further, an AC power supply may be used instead of the DC power supply.

Further, a magnet 88 is provided at an outer peripheral side of the metal target 84 to cause a magnetic field thereto. In this embodiment, a high-melting point metal, e.g., titanium (Ti), is used as the metal target 84. The Ti is sputtered into metal atoms or metal atom groups by Ar ions in the plasma and most of them are ionized while passing through the plasma. Further, the metal target 84 may be formed of one material selected from the group consisting of Ti, zirconium (Zr), hafnium (Hf), niobium (Nb), manganese (Mn) and tantalum (Ta).

Further, a cylindrical protection cover 90 made of, e.g., aluminum is installed under the metal target 84 so as to surround the processing space S. The protection cover 90 is grounded. Further, a lower portion of the protection cover 90 is bent inward to be positioned near a lateral portion of the mounting table 28. Further, a gas introduction unit 91 for introducing a predetermined gas into the processing chamber 22 is provided at the bottom portion 24 of the processing chamber 22. Specifically, the gas introduction unit 91 has a gas introduction port 92 through which a plasma excitation gas, e.g., an Ar gas, another necessary gas, e.g., an $N_2$ gas or the like is supplied via a gas control unit 94 including a gas flow rate controller, a valve and the like.

Further, each component of the plasma film forming apparatus 20 is connected to and controlled by an apparatus control unit 96 having, e.g., a computer or the like. To be specific, the apparatus control unit 96 controls operations of the bias power supply 60, the high frequency power supply 80 for generating the plasma, the variable DC target power supply 86, the gas control unit 94, the throttle valve 28, the vacuum pump 30 or the like. Further, the apparatus control unit 96 has a storage medium 98 storing a computer-readable program used for the above-mentioned control. The storage medium 98 may be a flexible disc, a compact disc (CD), a hard disc, a flash memory, a DVD or the like.

Next, the mounting table structure 32 in accordance with the embodiment of the present invention will be described in detail. As described above, the mounting table structure 32 mainly includes the ceramic mounting table 38 and the metal base 42 for supporting the mounting table 38 on its top surface side. As illustrated in FIGS. 2 and 3, the mounting table 38 is formed of a thin disc-shaped ceramic member. The chuck electrode 34 and the heater 36 are embedded in the mounting table 38 and are arranged over the entire surface of the mounting table 38 at upper and lower sides, respectively. The ceramic member may be formed of AlN, $Al_2O_3$, SiC or the like.

Further, a metal flange 100 is connected to a bottom surface of a peripheral portion of the mounting table 38. The flange 100 extends downwardly from the bottom surface of the peripheral portion of the mounting table 38. The flange 100 includes a flange main body 100A formed in a circular ring shape and a cylindrical coupling ring 100B which is low in height and connected to an inner peripheral side of the flange main body 100A. Further, to enhance a heat absorption capability, a circular ring-shaped plate 101 made of black alumite treated aluminum is inserted between the flange main body 100A and the peripheral portion of the mounting table 38. The circular ring-shaped plate 101 is divided into a plurality of, e.g., three, parts at predetermined lengths in a circumstantial direction and fixed to the flange 100 via screws (not shown). In this case, a small gap is provided between the plate 101 and the mounting table 38. Further, the number of the divided parts is not limited to three and the plate 101 may be formed as a single body without division. Further, as shown in FIG. 4 that is an enlarged view of the portion A of FIG. 3, an upper end portion of the coupling ring 100B is connected to the bottom surface of the peripheral portion of the mounting table 38 via, e.g., a brazing material 102. Further, a lower portion of the coupling ring 100B and an inner peripheral end of the flange main body 100A are connected to each other by, e.g., a welding material 104. Further, an outer peripheral end of the flange main body 100A is elongated to be positioned outwardly in a radial direction from an outer peripheral end of the mounting table 38.

Accordingly, the mounting table 38 and the flange main body 100A are integrally connected to each other. The flange main body 100A may be made of metal such as stainless steel, aluminum and an aluminum alloy. The coupling ring 100B may be made of metal such as Cobal (registered trademark).

Further, lifter pin openings 106 are respectively provided at peripheral portions of the mounting table 38 and the flange main body 100A to pass the lifter pins 50 therethrough. Further, screw holes 107 are provided at an outer peripheral side of the flange main body 100A. Further, an annual seal groove 108 is formed in a circumferential direction at an inner peripheral side of the bottom surface of the flange main body 100A.

Further, a gas opening 110 is provided at a central portion of the mounting table 38 to vertically pass therethrough. An upper end of the metal electrode line 56 is connected to the bottom surface of the mounting table 38 corresponding to the gas opening 110 by, e.g., brazing such that a backside gas can be discharged from the gas opening 110. Further, a connecting terminal 112 is branched off from an upper end portion of the electrode line 56, and an upper end of the connecting terminal 112 is connected to the chuck electrode 34. Accordingly, a bias voltage and a DC high voltage can be applied to the chuck electrode 34 if necessary.

Further, an upper end of the power supply line 62 is connected to the heater 36 via a connecting terminal 114 at the bottom surface of the central portion of the mounting table 38. Moreover, a thermometric contact point 116 provided at an upper end of the thermocouple line 70 is attached to the bottom surface of the central portion of the mounting table 38. Further, although one power supply line 62 is illustrated in the drawing, actually, a plurality of power supply lines are provided.

Further, the base 42 attached to the bottom side of the mounting table 38 mainly includes a disc-shaped base plate 118 made of metal and a disc-shaped cooling jacket 120 provided on the base plate 118. The base plate 118 and the cooling jacket 120 are integrally connected to each other by bolts (not shown). The base plate 118 and the cooling jacket 120 may be made of metal such as stainless steel, aluminum and an aluminum alloy.

The cooling jacket 120 has a diameter slightly smaller than that of the base plate 118. Further, the cooling jacket 120 has a size to be inserted in an inner side of the flange 100 in a close contact state. Further, the cooling jacket 120 has a thickness to be nearly in contact with the bottom surface of the mounting table 38 when they are assembled together.

The upper ends of the hollow support column 44 and the bellows 46 surrounding the support column 44 are airtightly joined to the bottom surface of a central portion of the base plate 118 by welding or the like. Further, a through hole 122 is provided at the central portion of the base plate 118 and the cooling jacket 120 to communicate with the hollow support column 44 such that the lines 56, 62 and 70 are inserted in the through hole 122 to pass therethrough.

Further, the lifter pins 50 are provided at a peripheral portion of the base plate 118 to be vertically movable. Screw holes 124 are formed at an outer peripheral side of the lifter pins 50 to communicate with the screw holes 107 of the flange main body 100A such that the flange main body 100A and the base plate 118 are integrally connected to each other by screws 126. For example, fifteen screws 126 are provided in a circumferential direction of the flange main body 100A. Further, a seal groove 128 is annularly provided in a circumferential direction at an inner peripheral side of the lifter pins 50 to face the seal groove 108 of the flange main body 100A. Further, a ring-shaped metal seal member 130 that is a feature of the present invention is inserted into the seal grooves 108 and 128, thereby providing hermetic sealing between the flange main body 100A and the base plate 118.

A metal seal member 130 interposed between the flange 100 and the base 42 provides airtightness to endure a high temperature and a high vacuum even though an inner pressure of the support column 44 becomes an atmospheric pressure. The metal seal member 130 may be made of metal such as stainless steel covered with aluminum.

Further, as described above, the cooling jacket 120 includes the coolant path 40 formed over its entire surface. Further, the inlet and outlet sides of the coolant path 40 are respectively connected to the coolant tubes 66A and 66B passing through the inside of the support column 44 to allow a coolant to flow therethrough. Further, the cooling jacket 120 is horizontally divided into two upper and lower parts, i.e., an upper block body 132A and a lower block body 132B. The coolant path 40 is provided in the lower block body 132B.

The divided surfaces of the cooling jacket 120, i.e., both facing surfaces of the upper block body 132A and the lower block body 132B are provided with irregularities 134A and 134B loosely engaged with each other, respectively. For example, the irregularities 134A and 134B are formed concentrically in a circumferential direction to increase a heat transfer area (facing area). Further, the irregularities 134A and 134B may be arranged in parallel rows, and no particular limitation is imposed on the arrangement. Further, the irregularities 134A and 134B have a rectangular shape in a cross sectional view, but it is not limited thereto. For example, the irregularities 134A and 134B may have a zigzag shape with a triangular cross section (see FIG. 5A) or a serpentine (sine curve) shape (see FIG. 5B) in a cross sectional view. The irregularities 134A and 134B may have any cross sectional shape if the heat transfer area is increased.

Further, spring recesses 136 are formed in a peripheral portion of the top surface of the lower block body 132B. A plurality of, e.g., four, spring recesses 136 are formed at equal intervals in a circumferential direction of the lower block body 132*3*. The coil springs 138 serving as elastic members are inserted in the spring recesses 136 and the upthrust pins 140 are inserted into the coil springs 138. The upper block body 132A is pushed up by the upthrust pins 140 such that the top surface of the upper block body 132A is in close contact with the bottom surface of the mounting table 38. Further, leaf springs, disc springs or the like may be used as the elastic members without being limited to the coil springs. The upthrust pins 140 are formed of a heat insulating material, e.g., $ZrO_2$ to prevent heat conductivity of contact portions of the upthrust pins 140 from being locally increased.

As described above, when the upper block body 132A is pushed up by the upthrust pins 140, a small gap is generated between the facing surfaces of the upper block body 132A and the lower block body 132B. An air of an atmospheric pressure is introduced into the gap via the hollow support column 44. Accordingly, the gap serves as a gaseous thermal conduction buffer layer 142 for alleviating heat transfer in a vertical direction. The gaseous thermal conduction buffer layer 142 allows uniform heat transfer to the backside of the semiconductor wafer W, thereby uniformly cooling the semiconductor wafer W. Accordingly, it is possible to prevent the semiconductor wafer W from being locally cooled.

Further, a thermal insulator 144 having a rectangular cross section and made of, e.g., alumina is provided in a ring shape on the outside of the peripheral portion of the mounting table 38. A shield 146 made of, e.g., aluminum is provided in a ring shape to surround the side surfaces of the thermal insulator 144 and the base 42 disposed thereunder.

Next, an example of a film forming method performed by using the plasma film forming apparatus 20 will be described. First, the processing chamber 22 is evacuated to a high vacuum level by operating the vacuum pump 30 without flowing any gas under control of the apparatus control unit 96, and this state is maintained for a certain period of time. Accordingly, a degassing treatment is carried out to discharge gas, moisture and the like attached to the surface of an inner structure or an inner wall of the processing chamber 22. In this case, the processing chamber 22 can be evacuated to a high vacuum level of, e.g., about $10^{-8}$ Torr as will be described later.

When the degassing treatment is completed, the semiconductor wafer W is loaded into the processing chamber 22 by using the transfer arm (not shown) from the transfer chamber 55 and mounted on the mounting table 38 of the mounting table structure 32 moved down. The mounting table structure 32 is moved up to a film forming position. Further, a DC high voltage of, e.g., about 4000 V is applied to the chuck electrode 34 of the mounting table 38 from the chuck power supply 58 via the electrode line 56. Accordingly, the semiconductor wafer W is attracted and held on the mounting table 38 by an electrostatic force. Thus, the semiconductor wafer W is prevented from being separated from the mounting table 38 and heat transfer between the semiconductor wafer W and the mounting table 38 is improved to facilitate temperature control.

Then, the gas control unit 94 is operated to flow an Ar gas and the throttle valve 28 is controlled such that the processing chamber 22 is maintained at a predetermined vacuum level for film formation. Subsequently, a DC power is applied to the metal target 84 from the target power supply 86 and a high frequency power (plasma power) is applied to the induction coil 78 from the high frequency power supply 80. At the same time, the heater power supply 64 is controlled to supply a power to the heater 36, so that the semiconductor wafer W is heated to a predetermined temperature and maintained at the predetermined temperature.

Meanwhile, the apparatus control unit 96 transmits the instructions to the bias power supply 60 to supply a bias power having a predetermined frequency of, e.g., about 13.56 MHz to the chuck electrode 34 of the mounting table 38. In the processing chamber 22, an Ar plasma is generated by a plasma power supplied to the induction coil 78 to produce Ar ions. The ions are attracted by a voltage supplied to the metal target 84 to collide with the metal target 84. The metal target 84 is sputtered to emit metal particles.

Most of the metal particles, i.e., metal atoms and metal atom groups, emitted from the sputtered metal target 84 are ionized when they pass through the plasma. The metal particles containing metal ions and electrically neutral metal atoms are dispersed in a downward direction. Particularly, an inner pressure of the processing chamber 22 is, e.g., about 5 mTorr during the film formation, thereby increasing the density of the plasma. Thus, the metal particles can be ionized with high efficiency.

Further, the metal ions are introduced into an ion sheath region which has a thickness of several millimeters (mm) on the surface of the semiconductor wafer W and is generated by the bias power supplied to the chuck electrode 34 of the mounting table 38. Then, the metal ions are attracted toward the semiconductor wafer W and accelerated with a strong directivity to be deposited on the semiconductor wafer W. Further, the semiconductor wafer W is heated by ions in the plasma that collide with the surface of the semiconductor wafer W during the film formation. Accordingly, in order to uniformly maintain the temperature of the semiconductor wafer W, the heat amount supplied from the heater 36 is controlled such that the heat amount transferred from the plasma to the semiconductor wafer W is equal to the heat amount emitted downward from the semiconductor wafer W.

For example, in order to uniformly maintain the temperature of the semiconductor wafer W, if the heat amount transferred from the plasma to the semiconductor wafer W is reduced, the heat amount supplied from the heater 36 is increased by the reduced amount. On the other hand, if the heat amount transferred from the plasma is too large, the heat amount supplied from the heater 36 is reduced correspondingly. Further, the coolant is continuously flowed through the coolant path 40 of the cooling jacket 120 of the base 42 to cool the cooling jacket 120 and remove the surplus heat generated in the heater 36, thereby facilitating the temperature control of the semiconductor wafer W.

Further, the lower end of the hollow support column 44 supporting the mounting table 38 is opened to the air. Accordingly, a region inside the support column 44 and under the mounting table 38 has an atmospheric pressure. Also, a gap between the upper block body 132A and the lower block body 132B forming the cooling jacket 120 has an atmospheric pressure. The gap serves as the gaseous thermal conduction buffer layer 142. Accordingly, the upper block body 132A positioned above the gap can be uniformly cooled over its entire surface without local cooling.

As a result, the upper block body 132A has a uniform temperature over its entire surface. Accordingly, the mounting table 38 positioned above the upper block body 132A can have a uniform temperature over its entire surface. Further, the semiconductor wafer W mounted on the mounting table 38 can have a uniform temperature over its entire surface. Further, an upward force is applied to the upper block body 132A by the upthrust pins 140 formed of a heat insulating material. Accordingly, the top surface of the upper block body 132A and the bottom surface of the mounting table 38 are in contact with each other, thereby achieving satisfactory heat transfer therebetween.

In this case, the temperature of the upper block body 132A is a process temperature that is a high temperature of, e.g., about 400° C., whereas the temperature of the lower block body 132B separated from the upper block body 132A by the gaseous thermal conduction buffer layer 142 is, e.g., about 50 to 60° C. Further, the facing surfaces of the upper and lower block bodies 132A and 132B defining the gaseous thermal conduction buffer layer 142 have irregularities to increase a heat transfer area. Thus, as described above, it is possible to realize efficient heat conduction and heat transfer therebetween while maintaining in-plane temperature uniformity.

Further, as described above, the upper block body 132A is not locally cooled by the function of the gaseous thermal conduction buffer layer 142. Accordingly, the ceramic mounting table 38 disposed on the upper block body 132A is not locally cooled, thereby preventing damage of the mounting table 38. Thus, the temperature of the mounting table 38 can be rapidly increased and throughput of the semiconductor wafer processing can be improved.

Furthermore, as described above, the upper block body 132A, the mounting table 38 and the flange 100 connected thereto have a high temperature of about 400° C. However, sealing between the flange 100 and the base plate 118 under the flange 100 is made by the metal seal member 130 which has a heat resistance. Accordingly, the airtightness of the processing chamber 22 can be improved due to the heat resistance, unlike a case where an O ring is used.

Further, the metal seal member 130 allows the processing chamber 22 to be evacuated to a high vacuum level of, e.g., about $10^{-8}$ Torr in the degassing treatment performed prior to the film formation. Since the degassing treatment is sufficiently performed, a pure metal film without contamination can be formed. In this regard, it was found from the experiment that a conventional plasma processing apparatus using an O ring as a seal member can be evacuated to a vacuum level of at most about $10^{-4}$ Torr, while the plasma processing apparatus in accordance with the embodiment of the present invention using the metal seal member 130 can be evacuated to a high vacuum level of, e.g., about $10^{-8}$ Torr.

As described above, in accordance with the embodiment of the present invention, the mounting table structure 32 for mounting thereon an object to be processed, e.g., a semiconductor wafer W, on which a metal-containing thin film is formed includes the ceramic mounting table 38 in which the chuck electrode 34 and the heater 36 are embedded, the metal flange 100 connected to the bottom surface of the peripheral portion of the mounting table 38, the metal base 42 joined to the flange 100 by the screws 126 and having the coolant path 40 for flowing a coolant, and the metal seal member 130 interposed between the flange 100 and the base 42. Accordingly, the processing chamber 22 can be evacuated to a high vacuum level by sufficiently performing a degassing treatment while enduring a high temperature.

(Experiment on Temperature Increase of Mounting Table Structure)

Figure 6:
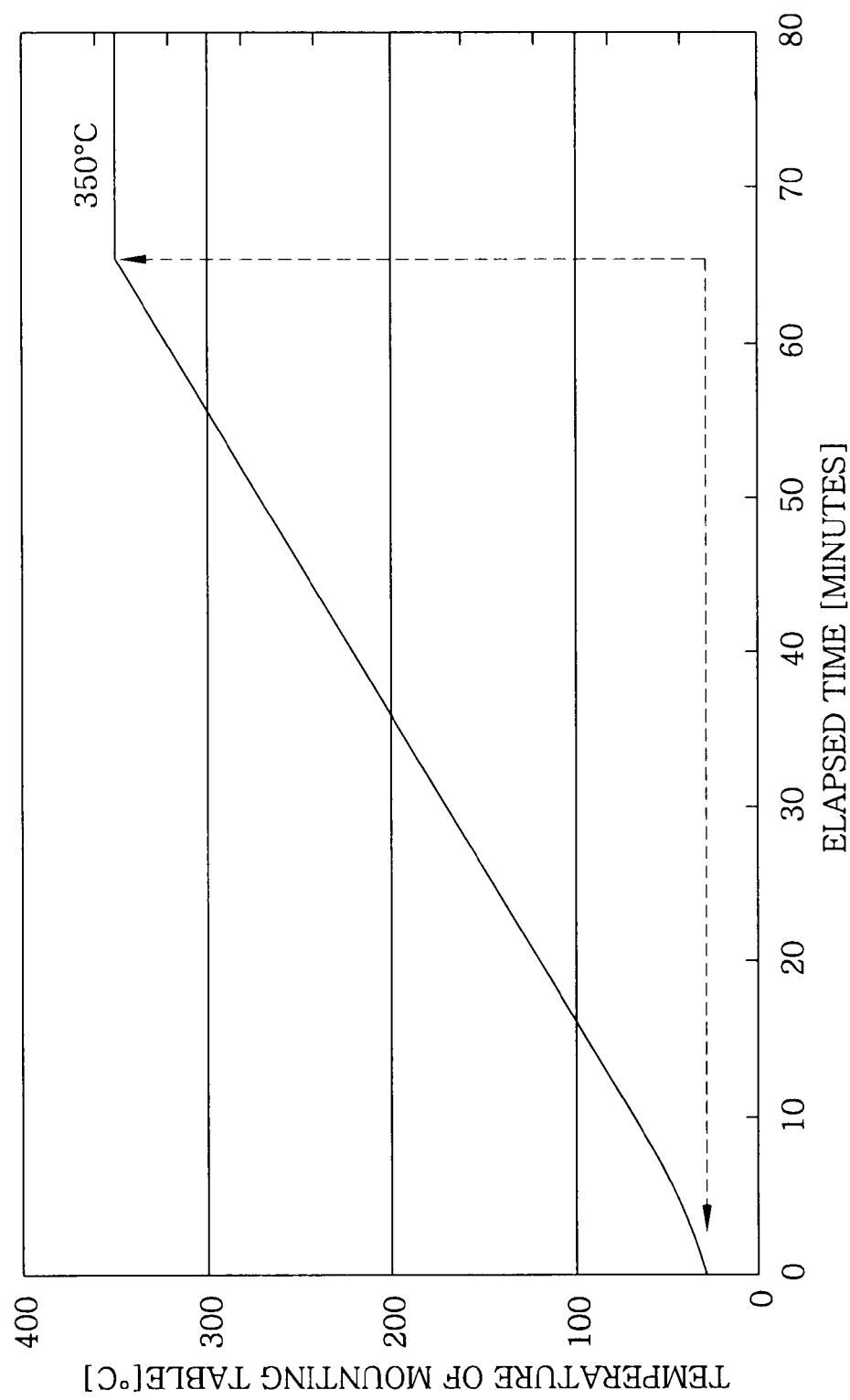
FIG. 6 is a graph showing a relationship between the temperature and the elapsed time after heating the mounting table of the mounting table structure.

An experiment on a temperature increase of the mounting table structure in accordance with the embodiment of the present invention was conducted and the evaluation results are explained. FIG. 6 is a graph showing a relationship between the temperature and the elapsed time after heating the mounting table 38 of the mounting table structure 32. In this case, the current of the heater 36 of the mounting table was maintained to be equal to or smaller than an upper limit of 15 A.

Referring to a graph shown in FIG. 6, the temperature of the mounting table 38 could be increased from a room temperature to 350° C. for about 65 minutes from the start of heating, thereby achieving a temperature rising rate of about 5° C./min. Accordingly, it can be seen that throughput of the semiconductor wafer processing can be sharply improved by using the mounting table structure in accordance with the embodiment of the present invention. For comparison, in the conventional plasma film forming apparatus, the ceramic mounting table is broken when the temperature of the mounting table is rapidly increased and a temperature rising rate is at most 2 to 3° C./min. Thus, it can be seen that the present invention has an advantage.

Second Embodiment

Figure 7:
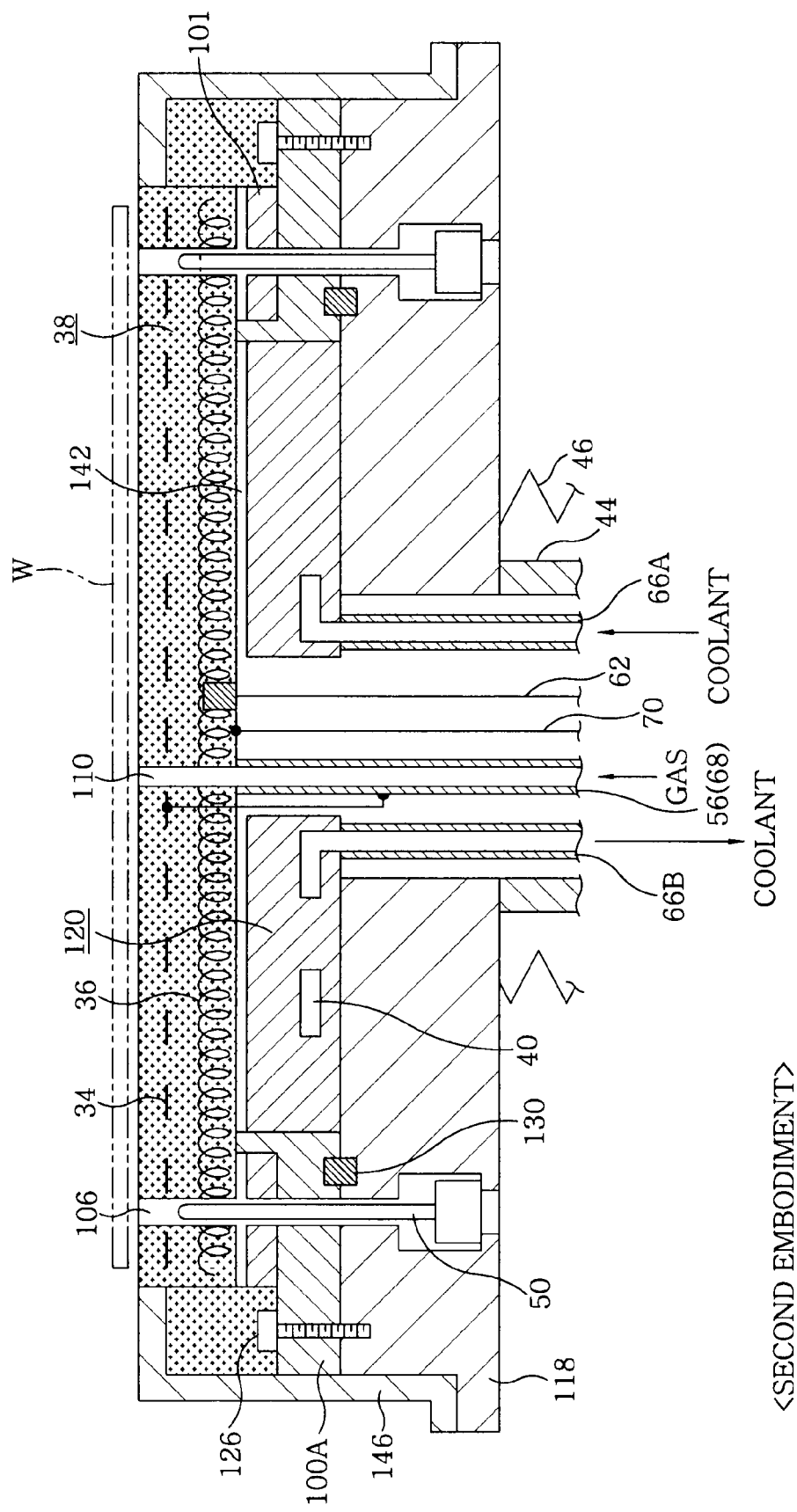
FIG. 7 is an enlarged cross sectional view showing essential parts of a mounting table structure in accordance with a second embodiment of the present invention.

Next, a mounting table structure in accordance with a second embodiment of the present invention will be described. FIG. 7 is an enlarged cross sectional view showing essential parts of the mounting table structure in accordance with the second embodiment of the present invention. In FIG. 7, the constitutional components substantially the same as those of FIG. 2 are represented by the same reference numerals and a description thereof will be omitted.

In the first embodiment, the cooling jacket 120 is vertically divided into two parts, the upper block body 132A and the lower block body 132B, but it is not limited thereto. As shown in FIG. 7, the cooling jacket 120 may be configured as a single body without division. In this case, a small gap may be provided between the top surface of the cooling jacket 120 and the bottom surface of the mounting table 38 to horizontally form the gaseous thermal conduction buffer layer 142.

In this case, although the heat transfer area between the top surface of the cooling jacket 120 and the bottom surface of the mounting table 38 is smaller than that of the first embodiment, substantially the same effect as that of the first embodiment can be obtained.

Third Embodiment

Figure 8:
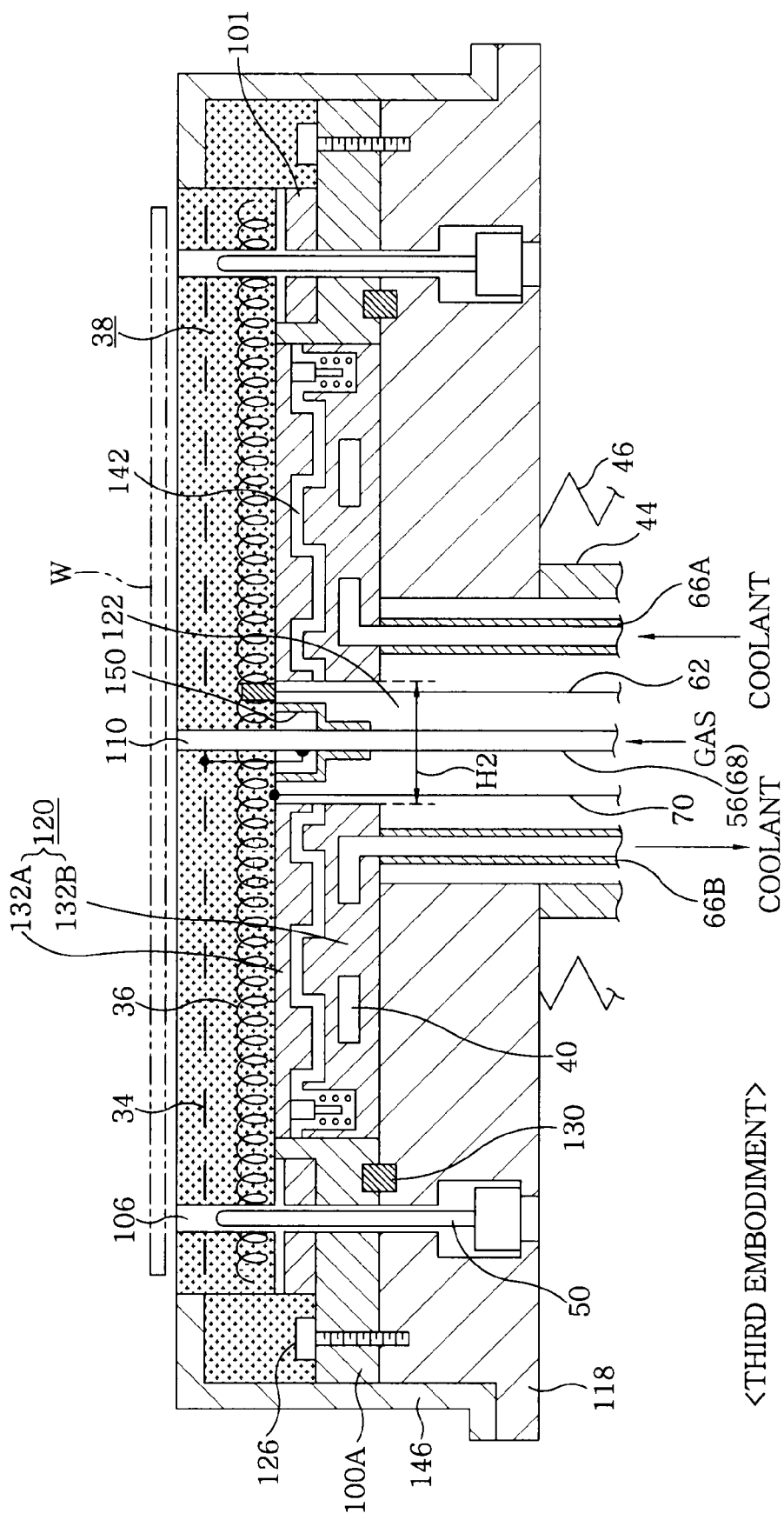
FIG. 8 is an enlarged cross sectional view showing essential parts of a mounting table structure in accordance with a third embodiment of the present invention.
Figure 9:
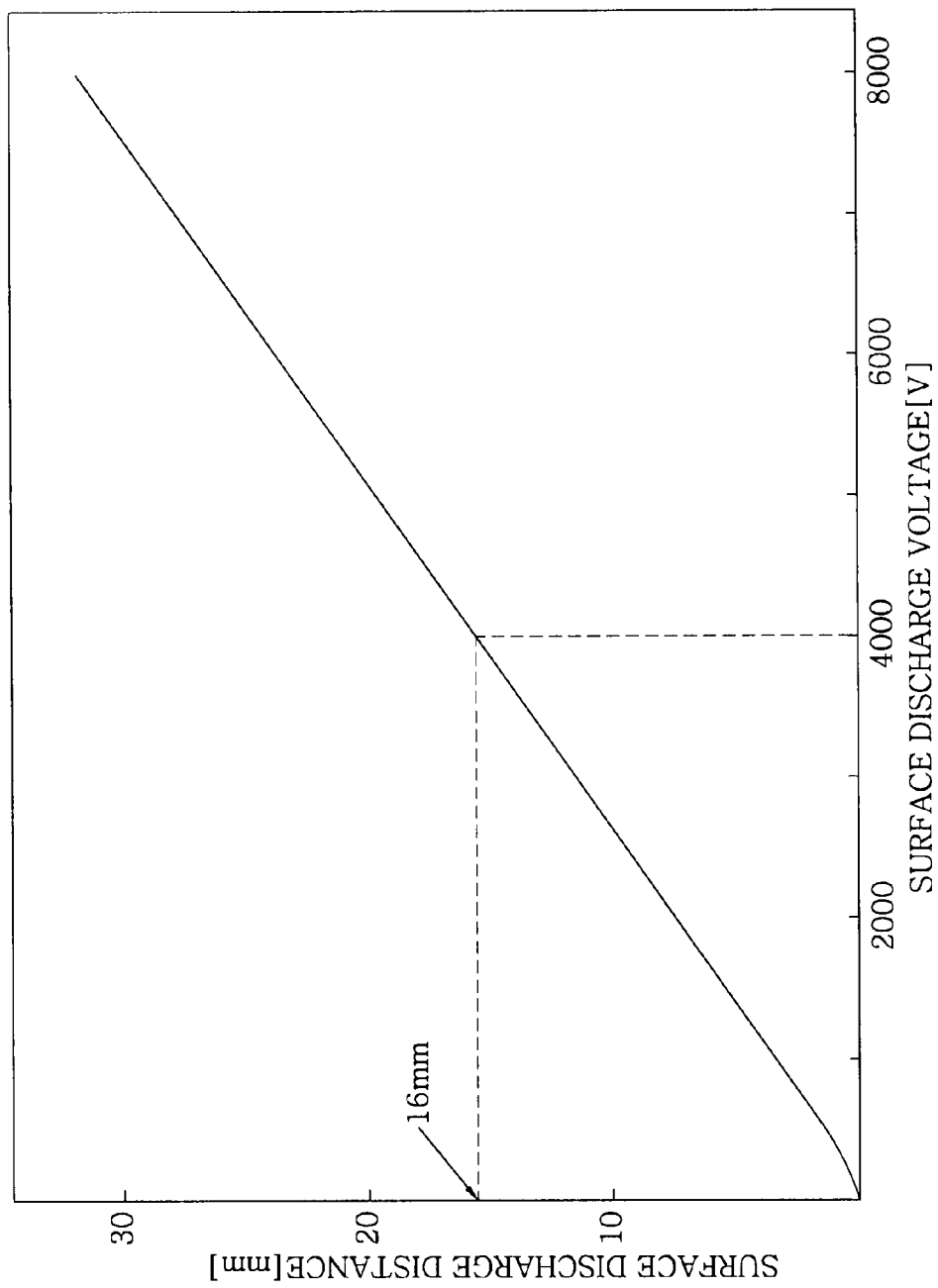
FIG. 9 is a graph showing a relationship between a surface discharge voltage and a surface discharge distance.
Figure 10:
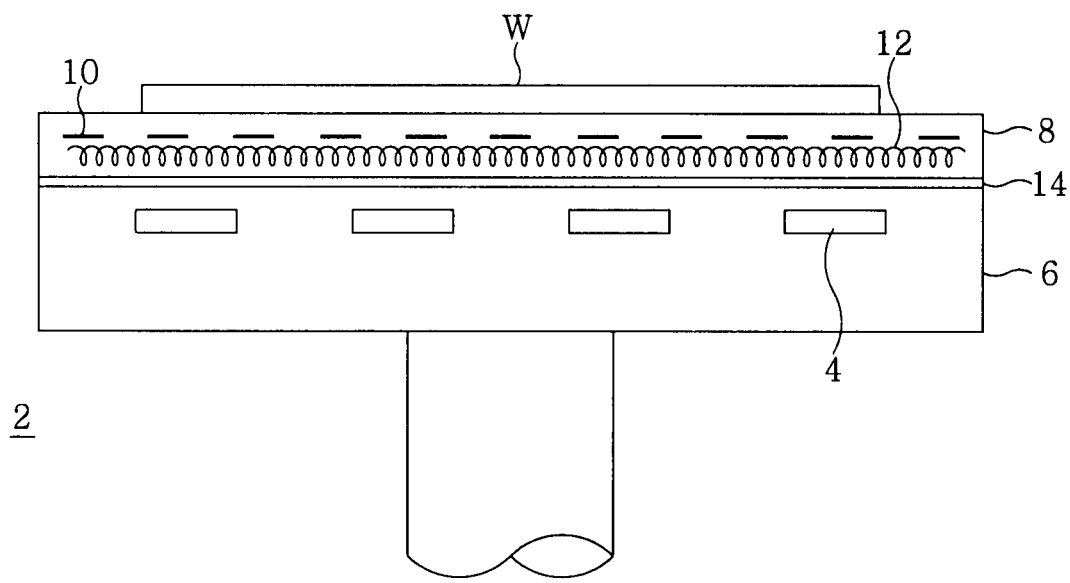
FIG. 10 schematically shows a conventional mounting table structure.

Next, a mounting table structure in accordance with a third embodiment of the present invention will be described. FIG. 8 is an enlarged cross sectional view showing essential parts of the mounting table structure in accordance with the third embodiment of the present invention. FIG. 9 is a graph showing a relationship between a surface discharge voltage and a surface discharge distance. In FIG. 8, the constitutional components substantially the same as those of FIG. 2 are represented by the same reference numerals and a description thereof will be omitted.

In the first and second embodiments, a surface discharge may be generated along the bottom surface of the mounting table 38 at connection portions between the bottom surface of the mounting table 38 and the upper ends of the respective lines, that is, the electrode line 56 to which a DC high voltage of, e.g., 4000 V is supplied and the power supply line 62 or the thermocouple line 70 having approximately zero potential. Accordingly, in the first and second embodiments, a diameter H1 (see FIG. 2) of the through hole 122 provided in the central portion of the cooling jacket 120 is set to be relatively large. The electrode line 56 is required to be separated from another line, i.e., the thermocouple line 70 or the power supply line 62 by a distance at which the surface discharge does not occur.

Consequently, when the diameter H1 is increased, an effective area of the cooling jacket 120 is reduced correspondingly, thereby increasing a thermally insensitive area. And a cooling effect is reduced at a central portion of the mounting table 38 so that the in-plane temperature uniformity of the semiconductor wafer W may degrade. It can be seen from the graph of FIG. 9 that the electrode line 56 to which a DC high voltage of, e.g., about 4000 V is applied is required to be separated from another line by 16 mm or more in order to prevent surface discharge.

Accordingly, in the third embodiment, as shown in FIG. 8, a hollow cap 150 made of a heat insulating material is joined to the bottom surface of the central portion of the mounting table 38 by an adhesive or the like, and an upper end portion of the electrode line 56 is inserted through the cap 150 to prevent surface discharge. A ceramic material such as AlN may be used as the insulating material of the cap 150. The diameter of the cap 150 is about 5 cm. Further, the upper end of the power supply line 62 or the upper end of the thermocouple line 70 is positioned on the outside of the cap 150.

As a result, a distance between the upper end of the electrode line 56 and the upper end of another line, i.e., the power supply line 62 or the thermocouple line 70 can be reduced. Accordingly, a diameter H2 of the through hole 122 can be reduced correspondingly. Thus, the effective area of the cooling jacket 120 can be increased, thereby decreasing a thermally insensitive area. Accordingly, it is possible to enhance in-plane temperature uniformity of the semiconductor wafer W.

Also in this embodiment, substantially the same effect as that of the first embodiment can be obtained. Further, the third embodiment can be applied to the second embodiment. Further, although a Ti film is formed as a metal-containing thin film in the above embodiments, it is not limited thereto. The present invention may be applied to cases in which other metal films such as a Cu film and a Ta film, a nitride film or an oxide film of these metals.

Further, although the support column is provided for the mounting table structure in the above embodiments, it is not limited thereto. For example, the present invention may be applied to a mounting table structure having a base, which is directly installed at a bottom portion of a chamber without a support column.

Further, a semiconductor wafer is exemplified as an object to be processed in the above embodiments. The semiconductor wafer includes a silicon substrate or a compound semiconductor substrate such as a GaAs substrate, a SiC substrate, and a GaN substrate. Further, the present invention may be applied to a glass substrate for a liquid crystal display, a ceramic substrate and the like without being limited thereto.

In the mounting table structure and the plasma processing apparatus in accordance with the embodiment of the present invention, the following excellent effects can be obtained.

The mounting table structure for mounting thereon an object to be processed to form a metal-containing thin film on the object includes a ceramic mounting table in which a chuck electrode and a heater are embedded, a metal flange connected to a bottom surface of a peripheral portion of the mounting table, a metal base which is joined to the flange by screws and has a coolant path for flowing a coolant therein, and a metal seal member interposed between the flange and the base. Accordingly, the mounting table structure can endure a high temperature and the processing chamber can be maintained at a high vacuum level by sufficiently performing a degassing treatment.

While the invention has been shown and described with respect to the embodiments, it will be understood by those skilled in the art that various changes and modification may be made without departing from the scope of the invention as defined in the following claims.

What is claimed is:

1. A mounting table structure for mounting thereon an object to be processed to form a metal-containing thin film on the object, comprising:

a ceramic mounting table in which a chuck electrode and a heater are embedded;

a metal flange connected to a bottom surface of a peripheral portion of the mounting table, wherein the flange extends downwardly from the bottom surface of the mounting table;

a metal base which is joined to the flange by screws and has a coolant path for flowing a coolant therein, wherein the metal base includes a disc-shaped base plate and a cooling jacket which is provided on the base plate, and the cooling jacket has therein the coolant path and is positioned at an inner side of the flange; and a metal seal member interposed between the flange and the base.

2. The mounting table structure of claim 1, wherein the cooling jacket is horizontally divided into an upper and a lower block body.

3. The mounting table structure of claim 2, wherein an upward force is applied to the upper block body from the lower block body by resilient members.

4. The mounting table structure of claim 3, wherein upthrust pins formed of a heat insulating material are provided at inner sides of the resilient members.

5. The mounting table structure of claim 3, wherein facing surfaces of the upper block body and the lower block body have irregularities engaged with each other.

6. The mounting table structure of claim 5, wherein a gap between the facing surfaces of the upper block body and the lower block body is formed as a gaseous thermal conduction buffer layer for alleviating heat transfer.

7. The mounting table structure of claim 1, wherein the mounting table is supported by a hollow support column made of metal.

8. The mounting table structure of claim 7, wherein the support column includes therein coolant tubes connected to the coolant path.

9. The mounting table structure of claim 7, wherein a through hole is formed at a central portion of the base to communicate with an inside of the hollow support column.

10. The mounting table structure of claim 9, wherein at least one of an electrode line connected to the chuck electrode, a power supply line connected to the heater, a thermocouple line for measuring the temperature of the mounting table and a backside gas line for supplying a gas between a top surface of the mounting table and a bottom surface of the object is inserted in the support column and the through hole to pass therethrough.

11. The mounting table structure of claim 10, wherein the electrode line is formed of a conductive metal pipe, and the metal pipe also serves as the backside gas line.

12. The mounting table structure of claim 10, wherein a hollow cap made of a heat insulating material is joined to a central portion of the bottom surface of the mounting table, and wherein an upper end portion of the electrode line is inserted through the cap and an upper end portion of the power supply line and an upper end portion of the thermocouple line are positioned on an outside of the cap.

* * * * *